United States Patent [19]

Young

[11] Patent Number: 4,563,647

[45] Date of Patent: Jan. 7, 1986

[54] NUCLEAR MAGNETIC RESONANCE METHODS AND APPARATUS

[75] Inventor: Ian R. Young, Sunbury-on-Thames, England

[73] Assignee: Picker International Limited, Wembley, England

[21] Appl. No.: 500,328

[22] Filed: Jun. 2, 1983

[30] Foreign Application Priority Data

Jun. 9, 1982 [GB] United Kingdom ............... 8216715

[51] Int. Cl.$^4$ ........................................... G01R 33/08
[52] U.S. Cl. ................................................. 324/309
[58] Field of Search ............... 324/309, 314, 310, 307

[56] References Cited

U.S. PATENT DOCUMENTS

| 4,318,043 | 3/1982 | Crooks et al. | 324/309 |
| 4,322,684 | 3/1982 | Hounsfield | 324/309 |
| 4,355,282 | 10/1982 | Young et al. | 324/309 |

FOREIGN PATENT DOCUMENTS

| 1525564 | 9/1978 | United Kingdom . |
| 1578910 | 11/1980 | United Kingdom . |
| 2056078 | 3/1981 | United Kingdom . |
| 2079946 | 1/1982 | United Kingdom . |

Primary Examiner—Ernest F. Karlsen
Assistant Examiner—Kevin D. O'Shea
Attorney, Agent, or Firm—Watts, Hoffmann, Fisher & Heinke Co.

[57] ABSTRACT

A method of exciting nuclear magnetic resonance at a particular location of a body comprises: exciting first nuclear spins in the body (A, Gx, −G′x, B, Gxd, C, Gy, −G′y, D) so that spins occurring in a first selected region of the body have their spin vectors lying in a first direction and any spins occurring elsewhere in the body have their spin vectors lying in a plane normal to the first direction; dephasing the spins in the body whose vectors lie in said plane (Gyd); and exciting nuclear spins in a second selected region of the body (E, Gz, −G′z) which intersects said first region at said particular location so that the vectors of the resultant spins in said particular location only are aligned in said plane.

The method finds particular application in providing data for chemical analysis of material at a particular location of a body.

Apparatus for carrying out the method is also described.

9 Claims, 4 Drawing Figures

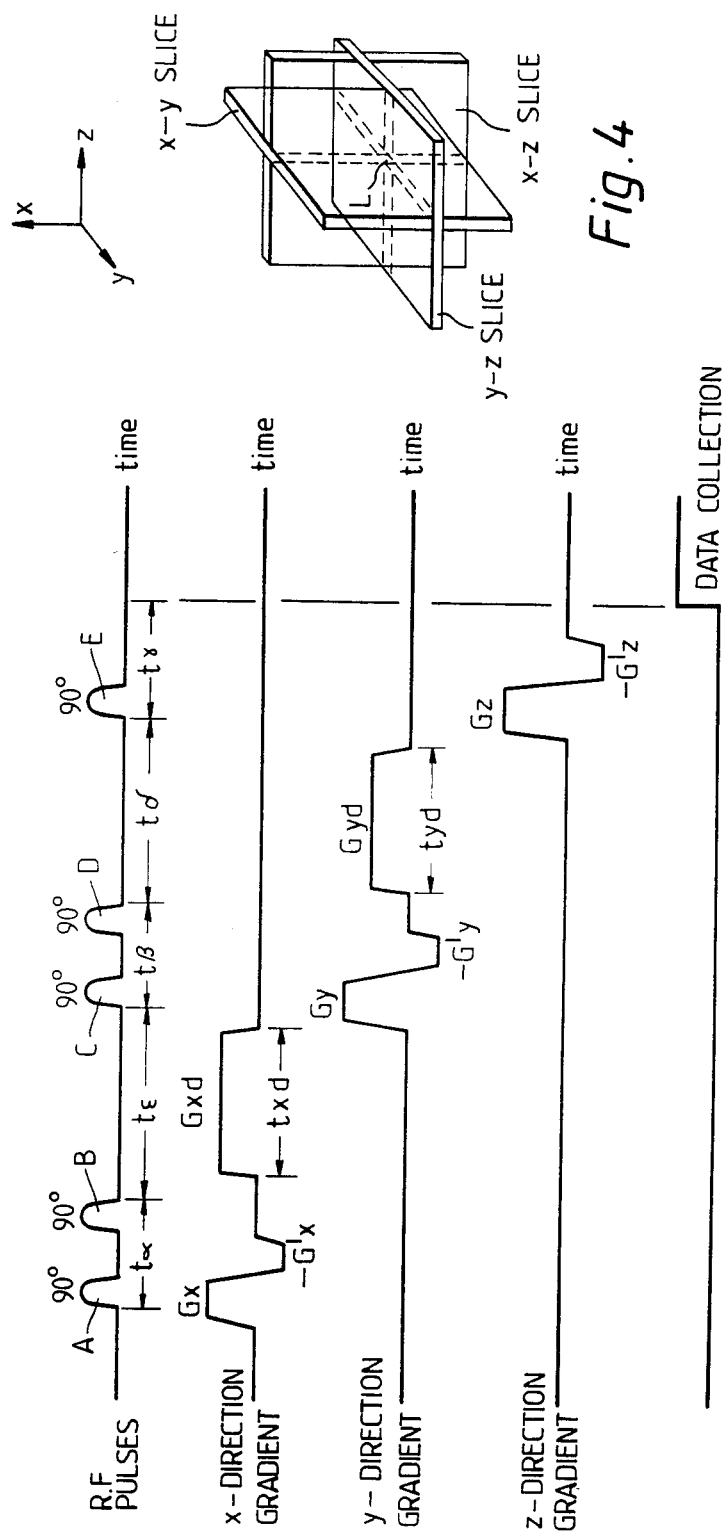

NUCLEAR MAGNETIC RESONANCE METHODS AND APPARATUS

This invention relates to methods and apparatus for chemical analysis of a selected region of a body by nuclear magnetic resonance (NMR) techniques.

NMR techniques have been used for the chemical analysis of material for many years, particularly by spectroscopy. More recently NMR techniques have been used to obtain images representing the distribution in a selected cross-sectional slice or volume of a body of a chosen quantity, e.g. the density of chosen nucleons, for example hydrogen protons, or of NMR spin relaxation time constants. Such distributions are similar to, although of different significance from, the distributions of X-ray attenuation provided by computerised tomography systems, and have thus found especial application in medical examination of patients.

Still more recently interest has been shown in providing a facility in NMR imaging apparatus whereby chemical analysis of a selected region of a body under examination can be carried out. Current proposals to this end allow collection of chemical analysis data for each of a plurality of locations along a selected line or each of a plurality of lines in a selected plane in the body. However, the degree of resolution for analysis purposes obtainable with such proposed methods is necessarily limited due to the requirement for spatial as well as chemical discrimination.

It would therefore be useful for the purpose of chemical analysis in NMR imaging apparatus to be able to excite material in a single location only in the body, e.g. a region corresponding to a single pixel of the image obtainable in use of the apparatus, thereby to facilitate the collection of sufficient data for high resolution NMR spectroscopy of the material in the selected location.

A well known method of exciting material in a selected slice only of a body for NMR imaging comprises applying a steady magnetic field to the body with a gradient in a chosen direction so that the magnetic field throughout the selected slice has a unique uniform value, and simultaneously applying an RF magnetic field to the body at the nuclear magnetic resonance frequency of appropriate material in the selected slice (such frequency being dependent on the steady magnetic field value).

At first sight it might seem that excitation of material in a single location might be carried out by performing successively excitation in three orthogonal slices which intersect at a point. Such a process, if effective, would amount to first exciting a whole slice, then dephasing excitation at all parts of the slice except the line where the first selected slice intersects the second selected slice and finally dephasing excitation at all locations along the line except that where the third selected slice intersects the line. Unfortunately it is found in practice that the integrals of the magnetic fields applied for the second and third slice selections are not necessarily effective to dephase excitation at all points in the first and second selected slices except the desired location. Moreover, further problems can arise due to the difficulty of holding the applied magnetic fields accurately at desired values throughout three successive slice selection sequences.

Thus in practice it has been found impossible to use such a process to produce excitation only at a single location.

It is an object of the present invention to provide an alternative NMR method capable of exciting material in a particular location only of a body to provide data for chemical analysis.

According to the present invention a method of exciting nuclear magnetic resonance at a particular location in a body comprises: exciting first nuclear spins in the body so that spins occurring in a first selected region of the body have their spin vectors lying in a first direction and any spins occurring elsewhere in the body have their spin vectors lying in a plane normal to the first direction; dephasing the spins in the body whose vectors lie in said plane; and exciting nuclear spins in a second selected region of the body which intersects said first region at said particular location so that the vectors of the resultant spins in said particular location only are aligned in said plane.

In a preferred method in accordance with the invention said first nuclear spins are produced by: exciting nuclear spins in the body so that the spin vectors lie in said first direction in a first selected slice of the body and elsewhere lie in said plane; dephasing the spins in the body whose vectors lie in said plane; and then exciting nuclear spins in the body so that in a second selected slice of the body which intersects the first slice at said first selected region the spin vectors lie in said first direction only where the first and second slices intersect and elsewhere lie in said plane.

In such a method the second selected region is preferably a third slice, and the first, second and third slices are suitably mutually orthogonal.

Each excitation of nuclear spins whose spin vectors lie in said first direction in a slice of the body and in said plane elsewhere in the body is suitably carried out by; applying a steady uniform magnetic field to said body in said first direction; applying in conjunction with said steady field a magnetic field in said first direction with a gradient in a direction normal to said slice to give a unique uniform field in said slice of said body; applying in conjunction with said gradient field a 90° RF magnetic field pulse at the Larmor frequency for the field in said slice to cause nuclear spins selectively therein whose spin vectors lie in said plane; and subsequently applying a second 90° RF magnetic field pulse in the absence of said gradient field so that the spins in said slice having vectors in said plane are rotated to lie in said first direction and any other spins in said body have their spin vectors rotated to lie in said plane.

The invention also provides apparatus for carrying out a method according to the invention.

One method and apparatus in accordance with the invention will now be described, by way of example, with reference to the accompanying drawings in which:

FIG. 3 illustrates the field sequence employed in the method; and

FIG. 4 further illustrates the method.

The apparatus required for carrying out the method is for the most part of conventional form, for example, as described in UK Patent Specification No. 1,578,910 (corresponding to U.S. Pat. No. 4,284,948) or No. 2,056,078 (corresponding to U.S. Pat. No. 4,355,282) to which reference should be made for a fuller description of the apparatus.

The essential features of such apparatus in so far as is required for an understanding of the present invention are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
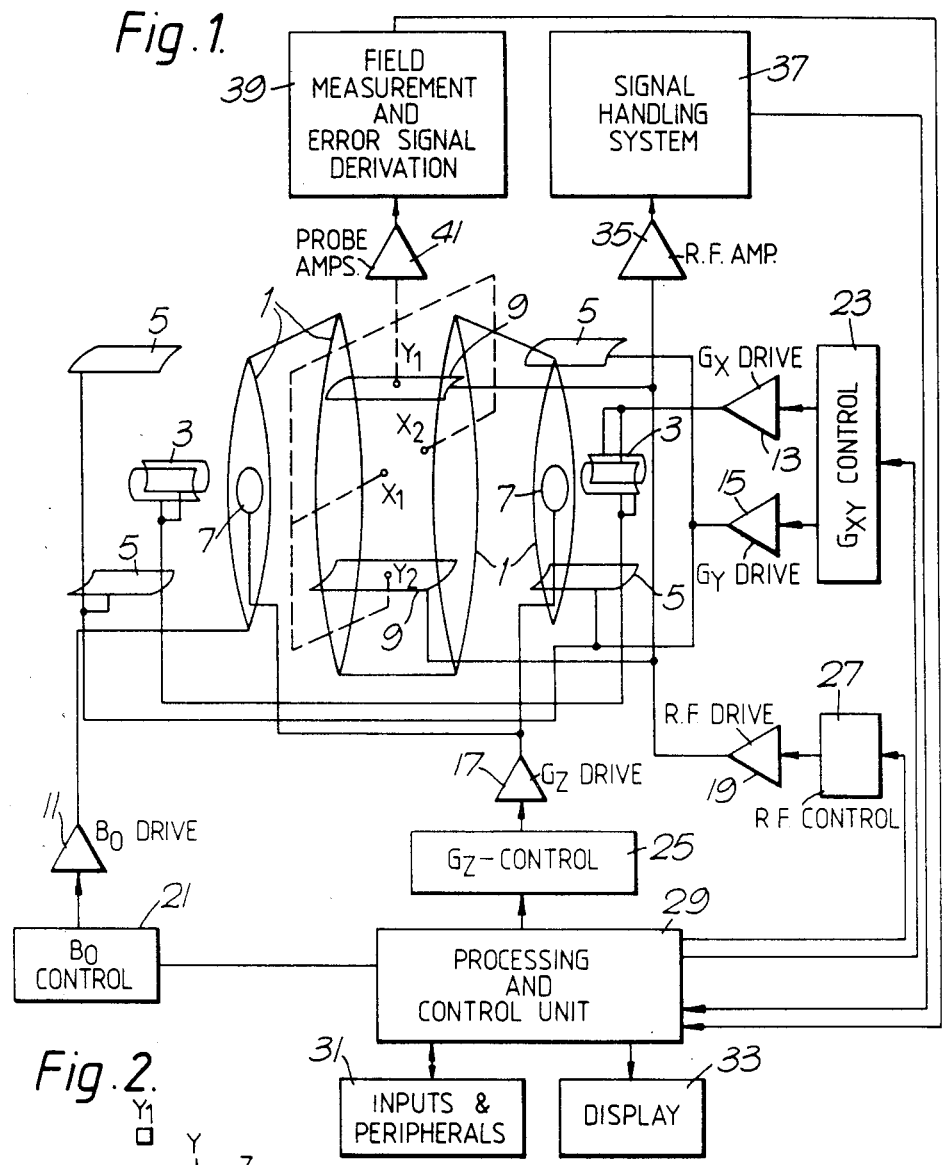
FIGS. 1 and 2 illustrate the apparatus diagrammatically.

Referring to FIG. 1, the first coil system comprises coils 1 which provide a steady uniform magnetic field Bo in the Z direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system 9 whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

In the drawing a single pair of coils 9 is shown for both applying and detecting RF fields, but in certain circumstances it may be preferable to provide separate coils for detecting the RF fields.

The various coils 1, 3, 5, 7 and 9 are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

Figure 2:
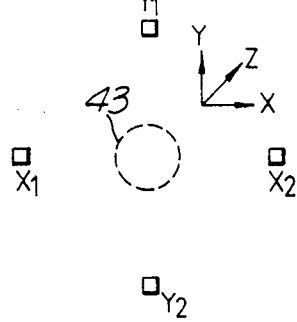

The apparatus also includes field measurement and error signal circuits 39 which receive signals via amplifiers 41 from field probes $X_1$, $X_2$, $Y_1$ and $Y_2$ which are disposed at suitable positions in relation to a slice 43 of the body being examined, as illustrated in FIG. 2, to monitor the applied magnetic fields.

Referring now to FIGS. 3 and 4 of the drawings, in use of the apparatus to excite nuclear magnetic resonance uniquely at a selected location in the body to be examined, a steady magnetic field Bo is applied to the body in the Z-direction. A further magnetic field in the Z-direction with a gradient Gx in the X-direction is then applied to the body so that a unique magnetic field in the Z-direction is applied to a selected cross-sectional slice lying nominally in a Y-Z plane (see FIG. 4). During application of this field gradient Gx an RF magnetic field pulse at the Larmor frequency for the material to be analysed in the unique field applied to the selected slice is applied by means of the second coil system 9. The RF field pulse A causes the spin vectors of nuclear spins of the material to be analysed in the selected slice, which hitherto were aligned in the Z-direction, to be tipped towards the X-Y plane in known manner. The integral of the pulse is chosen so that the pulse is just sufficient to tip the spin vectors through 90° into the X-Y plane, such a pulse being herein referred to as a 90° RF magnetic field pulse. It will be appreciated that the spin vectors of nuclear spins in parts of the body outside the slice are substantially unaffected since there is no resonance between the applied RF field and the Larmor frequency of these spins.

The gradient Gx is then removed and replaced by a reverse gradient $-G'x$ to re-phase the spins in the selected slice against dephasing resulting from the gradient across the slice during excitation, as described, for example, in the above mentioned UK Patent Specification No. 1,578,910.

The reverse gradient $-G'x$ is then removed and a further 90° RF pulse B is applied at the relevant Larmor frequency, this being now the same throughout the body due to the absence of any field gradient. This causes rotation by 90° of all the spin vectors in the body so that the spin vectors of the nuclear spins in the selected slice are rotated so as lie in the Z-direction, and the spin vectors of any nuclear spins in any other part of the body are rotated so as to lie in the X-Y plane.

A further magnetic field in the Z-direction with a gradient Gxd in the X-direction is then applied for a relatively long period txd. This dephases all the spins in the body whose spin vectors are not in the Z-direction, thus leaving the spins in the selected slice unaffected, but dephasing the spins elsewhere in the body.

A similar sequence is then carried out in respect of a selected slice in the X-Z plane by the application, in turn, of a slice selection gradient Gy in conjunction with an RF pulse C, a re-phasing reverse gradient $-G'y$ and RF pulse D, and a dephasing gradient Gyd.

However, in this case the first 90° RF pulse 5 will rotate from the Z-direction into the X-Y plane only the spin vectors of nuclear spins along the line where the selected X-Z plane slice intersects the previously selected Y-Z plane slice (see FIG. 2) since the spins in the selected X-Z plane slice not lying in the line of intersection do not lie in the Z-direction. Consequently the second RF pulse D will rotate into the Z-direction only the spin vectors along the line of intersection and the dephasing gradient will leave unaffected only the spins along the line of intersection, dephasing all other spins in the body, in particular those in the selected Y-Z plane slice not lying in the line of intersection with the selected X-Z plane slice which will have been rotated into the X-Y plane by the RF pulse D.

Thus, at the end of the second sequence all spins in the body are dephased except those in the line of intersection of the selected Y-Z plane and X-Z plane slices.

Finally a further RF pulse E is applied in conjunction with a slice selection field in the Z-direction with a gradient Gz in the Z-direction to select an X-Y plane slice which intersects the line of intersection of the selected Y-Z and X-Z slices at the selected location L (see FIG. 4). As a result, only the spin vectors of the spins in the selected location are rotated into the X-Y plane, the spins in other parts of the selected X-Y plane slice not being similarly rotated since they do not lie in the Z-direction. The gradient Gz also serves to dephase spins along the line of intersection of the Y-Z and X-Z slices other than at the selected location.

After application of a further re-phasing gradient $-G'z$ for spins in the selected location, the signal induced in the second coil system by these spins, commonly called the free induction decay (FID) signal is recorded. By analysis of the spectrum of the FID signal data regarding the chemical composition of the material in the selected location is then obtained in known manner.

It will be understood that the dephasing gradients Gxd and Gyd are required to be applied for a sufficiently long time txd and tyd to ensure that no re-phasing of spins outside the selected region can occur during data collection. This necessarily results in the process being somewhat slow, but the possibility of unacceptably large spin-to-spin relaxation occurring before data collection is not a serious problem since such dephasing does not occur during times $t\epsilon$ and $t\delta$ whilst the spins in the selected location are in the Z-direction, but only during the relatively short times $t\alpha$, $t\beta$ and $t\gamma$ during the excitation steps of the process.

Spin-to-lattice relaxation occurs during times $t\epsilon$ and $t\delta$ but is not normally a problem at least in medical examinations since the spin-to-lattice relaxation time constant $T_1$ for human tissue is typically 300 milliseconds and typical values of $t\epsilon$ and $t\delta$ are 20 milliseconds and 6 milliseconds respectively so that the FID signal is typically reduced from an initial value $N_o$ to $N_o[1-2e^{-6/300}(1-e^{-20/300})]$ i.e. by 12.5%.

It will be appreciated that whilst in the method described by way of example the three orthogonal slices are excited in the order Y-Z, X-Z, and X-Y, the order of excitation is immaterial.

If desired after the re-phasing gradient $-G'z$ and before data collection, a third 90° RF pulse in the absence of any field gradient followed by a third dephasing gradient Gzd may be applied followed by excitation of a further slice containing the selected location to ensure dephasing of spins along the line of intersection of the Y-Z and X-Z slices other than in the selected location. However, normally gradient Gz is sufficient to effect this.

It will be appreciated that whilst in the method described above by way of example a single location is selected, in other methods in accordance with the invention two or more non-contiguous locations may be selected and their FID signals recorded, for example, by successive selection of two or more spaced X-Y plane slices, the FID signal for each location being recorded before the selection of the slice defining the next location.

Furthermore, in other alternative methods in accordance with the invention by omitting excitation in one slice and the immediately following dephasing step, nuclear magnetic resonance may be uniquely excited in the line of intersection of two slices.

I claim:

1. A method of exciting nuclear magnetic resonance at a particular location in a body comprising: exciting first nuclear spins in the body so that spins occurring in a first selected region of the body have their spin vectors lying in a first direction and any spins occurring elsewhere in the body have their spin vectors lying in a plane normal to the first direction; dephasing the spins in the body whose vectors lie in said plane without dephasing the spins in the body whose vectors lie in said first direction; and exciting nuclear spins in a second selected region of the body which intersects said first region at said particular location so that the vectors of the resultant spins in said particular location only are aligned in said plane.

2. A method according to claim 1 wherein said first nuclear spins are produced by: exciting nuclear spins in the body so that the spin vectors lie in said first direction in a first selected slice of the body and elsewhere lie in said plane; dephasing the spins in the body whose vectors lie in said plane without dephasing the spins in the body whose vectors lie in said first direction; and then exciting nuclear spins in the body so that in a second selected slice of the body which intersects the first slice at said first selected region the spin vectors lie in said direction only where the first and second slices intersect and elsewhere lie in said plane.

3. A method according to claim 2 wherein said second selected region is a third slice of the body.

4. A method according to claim 3 wherein said first, second and third slices are mutually orthogonal.

5. A method according to claim 2 wherein each excitation of nuclear spins whose spin vectors lie in said first direction in a slice of the body and in said plane elsewhere in the body is carried out by; applying a steady uniform magnetic field to said body in said first direction; applying in conjunction with said steady field a magnetic field in said first direction with a gradient in a direction normal to said slice to give a unique uniform field in said slice of said body; applying in conjunction with said gradient field a 90° RF magnetic field pulse at the Larmor frequency for the field in said slice to cause nuclear spins selectively therein whose spin vectors lie in said plane; and subsequently applying a second 90° RF magnetic field pulse in the absence of said gradient field so that the spins in said slice having vectors in said plane are rotated to lie in said first direction and any other spins in said body have their spin vectors rotated to lie in said plane.

6. A system for exciting nuclear magnetic resonance at a particular location in a body, said system comprising:
  (a) apparatus and circuitry configured and positioned to excite first nuclear spins in the body so that spins occurring in a first selected region of the body have their spin vectors lying in a first direction and any spins occurring elsewhere in the body have their spin vectors lying in a plane normal to the first direction;
  (b) second apparatus and circuitry for dephasing the spins in the body whose vectors lie in said plane without dephasing the spins in the body whose vectors lie in said first direction, and
  (c) third apparatus and circuitry for exciting nuclear spins in a second selected region of the body which intersects said first region at said particular location so that the vectors of the resultant spins in said particular location only are aligned in said plane.

7. The system of claim 6, wherein:
  (a) said apparatus and circuitry for exciting said first nuclear spins comprises apparatus and circuitry arranged to excite nuclear spins in the body so that the spin vectors lie in said first direction in a first selected slice of the body, and said spins elsewhere lie in said plane;
  (b) said second apparatus and circuitry being coupled and positioned for exciting nuclear spins in the body in a second selected slice of the body intersecting the first slice at said first selected region with the spin vectors lying in said first direction only where the first and second slices intersect, and said spin vectors occurring elsewhere lying in said plane.

8. The system of claim 7, wherein: said second selected region comprises a third slice.

9. The system of claim 7, wherein:
(a) said apparatus and circuitry for exciting nuclear spins whose spin vectors lie in said first direction in a slice of said body and in said plane elsewhere in said body comprises apparatus and circuitry coupled and located for:
  (i) applying a steady uniform magnetic field to said body in said first direction;
  (ii) applying in conjunction with said steady field a magnetic field in said first direction with a gradient in a direction normal to said slice to impart a unique uniform field in said slice;
  (iii) applying, in conjunction with said gradient field, a 90° RF magnetic field pulse at the Larmor frequency for the field in said slice, and
  (iv) applying a second 90° RF magnetic field pulse in the absence of said gradient field.

* * * * *